United States Patent
Andia Vera et al.

(10) Patent No.: US 11,502,411 B2
(45) Date of Patent: Nov. 15, 2022

(54) RADIOFREQUENCY TRANSMISSION/RECEPTION DEVICE

(71) Applicant: PRIMO1D, Grenoble (FR)

(72) Inventors: Gianfranco Andia Vera, Grenoble (FR); Emmanuel Arene, Biviers (FR)

(73) Assignee: PRIMO1D, Grenoble (FR)

( * ) Notice: Subject to any disclaimer, the term of this patent is extended or adjusted under 35 U.S.C. 154(b) by 28 days.

(21) Appl. No.: 16/606,671

(22) PCT Filed: Apr. 16, 2018

(86) PCT No.: PCT/FR2018/050956
§ 371 (c)(1),
(2) Date: Oct. 18, 2019

(87) PCT Pub. No.: WO2018/193199
PCT Pub. Date: Oct. 25, 2018

(65) Prior Publication Data
US 2020/0381829 A1    Dec. 3, 2020

(30) Foreign Application Priority Data
Apr. 19, 2017 (FR) ...................... 1753405

(51) Int. Cl.
*H01Q 5/342* (2015.01)
*H01Q 5/321* (2015.01)
(Continued)

(52) U.S. Cl.
CPC ............. *H01Q 5/342* (2015.01); *H01L 24/48* (2013.01); *H01L 24/49* (2013.01);
(Continued)

(58) Field of Classification Search
CPC .......... H01Q 5/342; H01Q 5/321; H01Q 7/06; H01Q 9/16; H01Q 5/35; H01Q 7/00;
(Continued)

(56) References Cited

U.S. PATENT DOCUMENTS 8,093,617 B2   1/2012  Vicard et al.
8,471,773 B2 * 6/2013  Vicard ............. G06K 19/07754
                                                     343/702
(Continued)

FOREIGN PATENT DOCUMENTS

EP   1630728 B1   11/2007
EP   3319168 A1   5/2018
(Continued)

OTHER PUBLICATIONS

International Search Report for International Application No. PCT/FR2018/050956 dated Jul. 5, 2018, 3 pages.
(Continued)

*Primary Examiner* — Lester G Kincaid
*Assistant Examiner* — Maryam Soltanzadeh
(74) *Attorney, Agent, or Firm* — TraskBritt

(57) ABSTRACT

A radiofrequency transmission/reception device includes a first and a second conductive wire element, a first far-field transmission/reception chip and a second near-field transmission/reception chip. The first and the second wire element combine with the characteristic impedance of the second transmission/reception chip in order to form a coupling device associated with the first transmission/reception chip at the operating frequency of the first chip. The first and the second wire element combine with the characteristic impedance of the first transmission/reception chip in order to form a coupling device associated with the second transmission/reception chip at the operating frequency of the second chip.

16 Claims, 4 Drawing Sheets

(51) Int. Cl.
*H01L 23/00* (2006.01)
*H01L 25/065* (2006.01)
*H01Q 7/06* (2006.01)
*H01Q 9/16* (2006.01)
*H04B 5/00* (2006.01)
*H04B 7/24* (2006.01)

(52) U.S. Cl.
CPC ......... *H01L 25/0655* (2013.01); *H01Q 5/321* (2015.01); *H01Q 7/06* (2013.01); *H01Q 9/16* (2013.01); *H04B 5/0012* (2013.01); *H04B 5/0031* (2013.01); *H04B 5/0075* (2013.01); *H04B 7/24* (2013.01); *H01L 2224/48138* (2013.01); *H01L 2224/48993* (2013.01); *H01L 2224/49175* (2013.01)

(58) Field of Classification Search
CPC ........ H01Q 9/20; H01Q 1/2225; H01L 24/48; H01L 24/49; H01L 25/0655; H01L 2224/48138; H01L 2224/48993; H01L 2224/49175; H01L 2224/04042; H01L 2924/3011; H01L 2224/69; H01L 2223/6611; H01L 2223/6677; H01L 2223/6672; H01L 23/66; H04B 5/0012; H04B 5/0031; H04B 5/0075; H04B 7/24; H04B 5/00; G06K 19/07767
See application file for complete search history.

(56) References Cited

U.S. PATENT DOCUMENTS

| | | | |
|---|---|---|---|
| 8,723,312 | B2 | 5/2014 | Brun et al. |
| 8,782,880 | B2 | 7/2014 | Vicard et al. |
| 8,814,054 | B2 | 8/2014 | Brun et al. |
| 2009/0073070 | A1* | 3/2009 | Rofougaran ......... H04B 5/0012 343/793 |
| 2011/0068987 | A1 | 3/2011 | Carr |
| 2012/0258660 | A1 | 10/2012 | Rajendran et al. |
| 2014/0117927 | A1 | 5/2014 | Chateau et al. |
| 2015/0024589 | A1 | 1/2015 | Brun |
| 2015/0230336 | A1 | 8/2015 | Vicard et al. |
| 2015/0318409 | A1 | 11/2015 | Vicard et al. |

FOREIGN PATENT DOCUMENTS

| | | |
|---|---|---|
| FR | 2917895 B1 | 4/2010 |
| FR | 2937464 B1 | 2/2011 |

OTHER PUBLICATIONS

International Written Opinion for International Application No. PCT/FR2018/050956 dated Jul. 5, 2018, 6 pages.

* cited by examiner

RADIOFREQUENCY TRANSMISSION/RECEPTION DEVICE

CROSS-REFERENCE TO RELATED APPLICATIONS

This application is a national phase entry under 35 U.S.C. § 371 of International Patent Application PCT/FR2018/050956, filed Apr. 16, 2018, designating the United States of America and published as International Patent Publication WO 2018/193199 A1 on Oct. 25, 2018, which claims the benefit under Article 8 of the Patent Cooperation Treaty to French Patent Application Serial No. 1753405, filed Apr. 19, 2017.

TECHNICAL FIELD

The present disclosure relates to a radio frequency reception transmission device.

BACKGROUND

Documents U.S. Pat. No. 8,471,773 and FR2917895 are known as examples of such a device that can be used in the field of RFID (for "Radio Frequency Identification") electronic labelling. The device includes a chip and a coupling device, often referred to as an "antenna," for coupling of the chip to an electromagnetic field allowing communication with a transmission-reception terminal. The first document mentioned above states that, depending on the transmission frequency used between the transmission-reception terminal and the radio frequency device, the antenna of this device is configured to form either a loop (for transmission frequencies between a few hundred kilohertz and a few megahertz) or configured to form a dipole (for transmission frequencies between a few megahertz and a few gigahertz).

In the first type of RF device, with a relatively low frequency operating range, communication between the terminal and the RF device is only possible at a very short distance. A signal is induced in the coupling device without it actually forming an antenna (although it is customary to refer to this coupling device as an "antenna"). The coupling device can take the form of a loop. In this case, in reception mode, the signal can be developed by magnetic coupling. In other configurations of the RF device, the coupling device takes the form of a simple transmission line and the signal develops by electrical coupling with a transmission line of the transmitter, placed nearby. Whatever the form, electrical or magnetic, of the coupling between the transmitter and antenna, the transmitting-receiving chip is configured to operate "in the near field." The transmitting-receiving chip includes a modulation circuit, a demodulation circuit and a power supply circuit, associated with the antenna and configured to make the transmission-reception chip active in the relatively low frequency operating range.

The second type of RF device, with a higher frequency operating range, is generally used for logistics applications, to identify, count, and/or track objects. The coupling device comprises a dipole antenna whose length is adjusted to the transmission frequency of the transmission-reception terminal and resonates with the generated electromagnetic field. This configuration makes it possible to establish, depending on the sensitivity of the chip and the terminal, a communication between the chip and the terminal when they are several meters apart, up to 10 m or 20 m. Such a "far-field" transmission-reception chip includes a modulation circuit, a demodulation circuit and a power supply circuit, associated with the dipole antenna and configured to make the transmission-reception chip active in the relatively high frequency operating range.

Whether the transmission-reception chip is configured to operate in the near or far field, it generally has an essentially capacitive internal impedance in the picofarad range. This is particularly the case for so-called "passive" transmission-reception chips, which draw their energies from the field received by the antenna.

For example, from documents US2012/258660 and U.S. Pat. No. 9,166,276, transmission-reception chips are known to operate in both near and far fields. The transmission-reception devices formed from these chips therefore remain relatively cumbersome and have a form factor that does not allow them to be integrated into all kinds of objects.

BRIEF SUMMARY

The present disclosure is intended to compensate for all or part of the above-mentioned disadvantages. In particular, this disclosure aims to provide a transmission-reception device capable of operating in both near and far fields, which has a more favorable form factor than state-of-the-art solutions.

To achieve the aim of the present disclosure, a radiofrequency transmission-reception device is disclosed herein that comprises:
  a first and a second conductive wire element each having a first end, a second end and a central part;
  a first far-field transmission-reception chip having a first operating frequency range, a first characteristic impedance, and two longitudinal connection areas; a first segment of each wire element being attached to each of the areas of the first chip, respectively; and
  a second near-field transmission-reception chip having a second operating frequency range, lower than the first range, a characteristic second impedance, and two longitudinal connection areas; a second segment of each wire element being attached to each of the areas of the second chip, respectively.

According to the present disclosure, the first and second wire elements combine with the characteristic impedance of the second transmission-reception chip to form a coupling device associated with the first transmission-reception chip in the first frequency range. They also combine with the characteristic impedance of the first transmission-reception chip to form a coupling device associated with the second transmission-reception chip in the second frequency range.

According to other advantageous and limiting characteristics of the present disclosure, taken alone or in any technically feasible combination:
  the first and/or second chip is formed of a substrate comprising a functional circuit and a cover, the assembly of the cover and the substrate allowing the longitudinal connection areas to be formed in the form of longitudinal grooves;
  the first operating frequency range is in one of the HF, UHF or VHF frequency bands, and the second operating frequency range is in one of the LF or MF frequency bands;
  the first characteristic impedance and the second characteristic impedance have a capacitive nature;
  a longitudinal segment positioned in the first wire element is fixed on the connection area of the first chip;
  a longitudinal segment positioned at one end of the first wire element is fixed on the other connection area of the first chip;

a longitudinal segment positioned on the first wire element is fixed on the connection of the second chip;

a longitudinal segment positioned in the part of the second wire element is fixed on the other connection of the second chip;

the coupling device associated with the first transmission-reception chip in the first frequency range is a dipole antenna;

the coupling device associated with the second transmission-reception chip in the second frequency range consists of transmission lines;

the device comprises an inductive component respectively connected to the first wire element and the second wire element;

the coupling device associated with the second transmission-reception chip in the second frequency range consists of a magnetic induction loop;

the inductive component is in the form of a chip having two longitudinal connection areas to which two segments of the first and second wire elements are fixed;

the inductive component is placed on the side of the first chip opposite to the second chip;

the inductive component is integrated into the first chip; and the space between the first and second chip is filled with a ferromagnetic material.

BRIEF DESCRIPTION OF THE DRAWINGS

Other characteristics and advantages of the present disclosure will emerge from the detailed description of the present disclosure that follows with reference to the appended figures wherein.

DETAILED DESCRIPTION

To ensure the simplicity of the following description, the same references will be used for elements that are identical or perform the same function in the various disclosed embodiments of the process.

The present disclosure proposes a radiofrequency transmission-reception device comprising an antenna made up of two wire elements, and transmission-reception chips each comprising two longitudinal connection areas, parallel to each other and to which two segments of the wire elements are respectively fixed.

The present disclosure may use the connection technology referred to in the art as E-THREAD™. This technology is described, for example, in documents U.S. Pat. Nos. 8,093, 617, 8,723,312, US2015318409, U.S. Pat. Nos. 8,782,880, 8,814,054 or US2015230336. However, in the following paragraphs, and in order to provide a complete description, the main characteristics of this technology are described herein.

Figure 1:
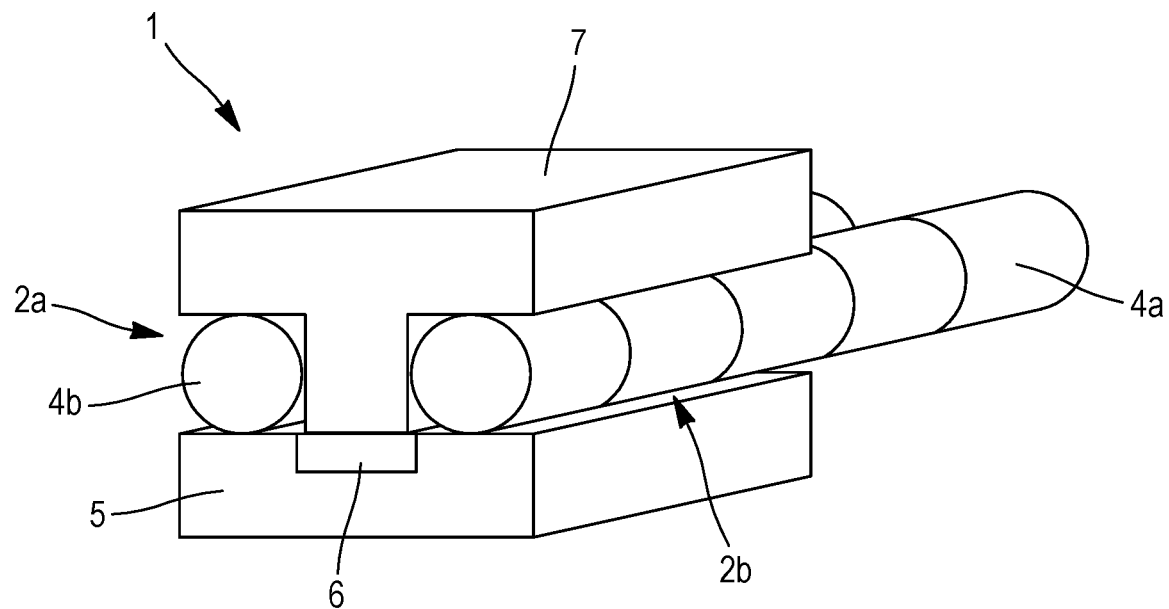
FIG. 1 is a perspective view of a chip of a device according to the present disclosure.
Figure 2:
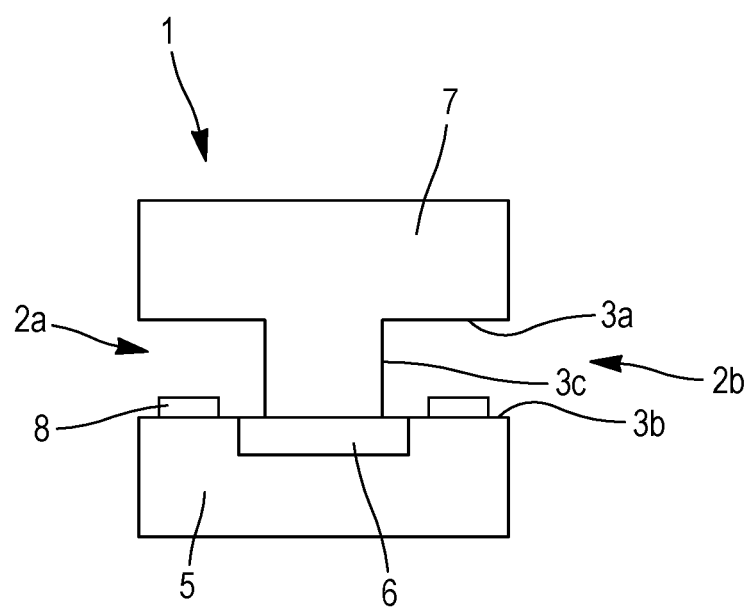
FIG. 2 is a cross-sectional view of a chip of a device according to the present disclosure.

FIG. 1 thus shows a perspective view of an electronic component or chip 1 compatible with E-THREAD™ connection technology. In this FIG. 1, chip 1 is assembled to two conductive wire elements 4a, 4b (and sometimes more simply referred to as "wire elements" in the following description). FIG. 2 shows a cross-sectional view of chip 1, without the wire elements 4a, 4b.

Chip 1 has two longitudinal grooves 2a, 2b, forming the two longitudinal connection areas, each of these grooves being defined by three walls 3a, 3b, 3c of the elements constituting chip 1, in the example shown. In this disclosure, "longitudinal groove" (or "longitudinal area") refers to a groove or area extending from one side of chip 1 to the other in a direction that arbitrarily defines the length of chip 1. Each groove 2a, 2b is designed to accommodate a segment of a wire element 4a, 4b. Each wire element 4a, 4b has a main axis, parallel to the axis of the longitudinal groove 2a, 2b in which it is located.

Each wire element 4a, 4b can be mechanically embedded in one of the longitudinal grooves 2a, 2b and/or held by an adhesive, by welding or by any other means in this groove. In all cases, the wire elements 4a, 4b and the chip are assembled together in a fixed manner.

As shown in FIGS. 1 and 2, chip 1 may include a substrate 5 on and in which a functional circuit 6 may be formed. At least one of the walls 3a, 3b, 3c of each longitudinal groove 2a, 2b may be provided with a stud 8 or a plurality of such studs. When the wire elements 4a, 4b are housed in their grooves 2a, 2b, they are in contact with the stud(s) 8 positioned in this groove. These studs 8 can contribute to the embedding of the wire element in the groove. Some of these studs 8 can be electrically connected to terminals of the functional circuit 6, and therefore form connection studs, for example, via conductor tracks formed on or in substrate 5.

When it is necessary to form an electrical contact between a wire element 4a, 4b and a connection stud 8, it may be necessary to strip the conductive wire element 4a, 4b beforehand, if it is provided with an insulating sheath.

Alternatively or in addition, the connection stud 8 can have a sharp blade shape that pierces the sheath when the wire is inserted to establish electrical contact.

Further, in the description of FIGS. 1 and 2, the chip 1 also includes a cover 7, for example, with a T-shaped section, the base of the T being assembled with a main face of the substrate 5, as shown in FIG. 2. The longitudinal grooves 2a, 2b are formed by assembling the T-shaped cover 7 and the substrate 5. Cover 7 may also be equipped with a functional circuit, studs 8 and conductive tracks electrically connected to the functional circuit 6 of substrate 5 or the functional circuit of cover 7 if such a circuit is present.

Other embodiments of chip 1 than the one shown in FIGS. 1 and 2 are possible. For example, chip 1 may consist of a flat support having the functional circuit, the longitudinal grooves being formed, for example, by etching, on two opposite lateral faces of this support, or on one and/or the other of the main faces of this support.

In a particular embodiment, chip 1 does not have any groove. Cover 7 can only be temporarily connected to substrate 5 to temporarily form grooves and allow the wire elements 4a, 4b to be precisely fixed to substrate 5 in two parallel longitudinal connection areas. After this fixing step, cover 7 can be disassembled, and chip 1 in this case does not include cover 7.

A variant of this embodiment is described in document US2015024589 in which cover 7 is formed by applying an electrically insulating material to substrate 5 after fixing the wire elements 4a, 4b, for example, at two longitudinal connection areas 2a, 2b parallel to each other.

According to another embodiment, the chip 1 can consist of two flat supports of identical or similar dimensions, each having a functional circuit. The flat supports are each assembled to the two opposite sides of a smaller spacer to define the two longitudinal grooves 2a, 2b of the chip 1.

Whatever the embodiment chosen, a chip 1 compatible with the present disclosure has a functional circuit 6, two longitudinal connection areas 2a, 2b each capable of receiving a segment of a conductive wire element 4a, 4b. The conductive wire elements 4a, 4b are in electrical contact with the functional circuit 6.

The fixing of the conductive wire elements 4a, 4b on the longitudinal areas 2a, 2b of a chip 1 can be automated, for example, using insertion equipment such as that described in document U.S. Pat. No. 8,782,880 or US2015024589.

Large wire elements can be supplied in the equipment in the form of coils; and chips 1, similar to the one just presented, stored in a tank of the equipment. Large wire elements are unwound from the coils to be supplied, parallel to each other, to a pinching zone of the piece of equipment. The equipment is also configured to successively bring chips 1 from the tank to this pinching zone and to engage a segment of each large wire element in either of the longitudinal grooves 2a, 2b, or more generally to attach each wire element 4a, 4b to the longitudinal connection areas 2a, 2b. A chain is thus formed, which consists of a plurality of chips 1 connected by large wire elements. The equipment can be provided with a plurality of tanks to store chips of different natures and form a chain of composite chips according to an alternation, which may be chosen. The chip chain can be wound on a support to form a storage or transport reel. Functional elements, i.e., sections of this chain, can be removed from the reel by cutting the wire elements 4a, 4b according to a desired cutting pattern, as described in the above-mentioned document U.S. Pat. No. 8,471,773.

The present disclosure takes advantage of the general characteristics of the technology presented above to offer a radiofrequency transmission-reception device 10 that can operate in both far and near fields.

Figure 3A:
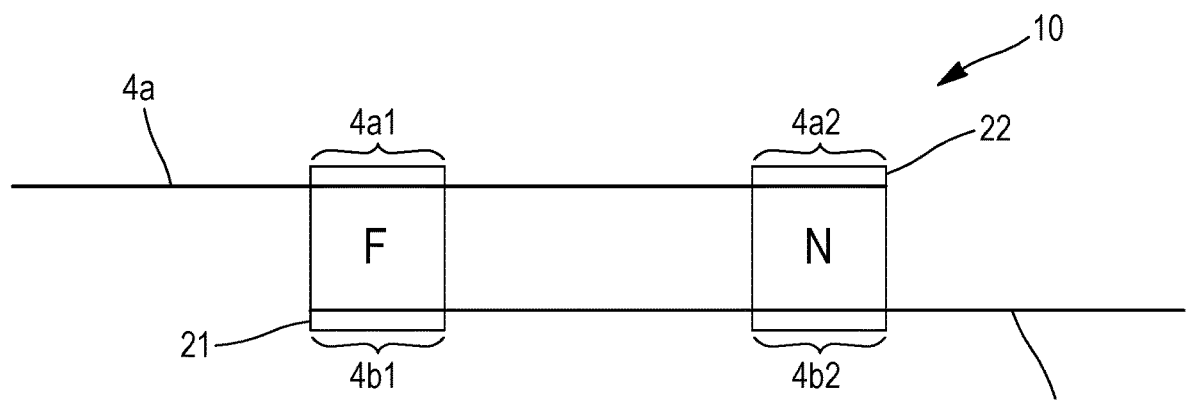
FIGS. 3a to 3c show respectively a transmission-reception device according to the present disclosure, and its condition at two different operating frequencies.

Such a device 10 is shown in FIG. 3a. The device 10 includes a first and a second conductive wire element 4a, 4b. Each of these wire elements has a first end, a second end, and a central part. Device 10 also includes a first far-field transmission-reception chip 21 operating in a first frequency range. The first chip 21 can be a passive or active RFID chip, operating in the HF, VHF or UHF frequency bands. The first chip 21 therefore has a functional circuit 6 comprising a modulation circuit and a demodulation circuit designed to operate in a frequency range within one of these frequency bands. The first chip 21 can transmit different data such as its unique identifier, status data, telemetry data such as temperature or humidity at a relatively large distance, several meters or tens of meters, if the first chip 21 is equipped with sensors to measure this information.

The first chip 21 has two longitudinal connection areas to which two longitudinal segments 4a1, 4b1 of the wire elements 4a, 4b are respectively fixed. The areas are equipped with connection studs to connect each wire element 4a, 4b to the functional circuit 6 of the first far field chip 21.

The first chip 21 has a first characteristic impedance between its connection studs. This characteristic impedance may depend on frequency, but usually it is capacitive in nature and typically has a value of a few picofarads.

To further the description in FIG. 3a, the radiofrequency transmission-reception device 10 also includes a second near-field transmission-reception chip 22, operating in a second frequency range. This second operating frequency range is lower than the first operating frequency range of the first chip 21. This can be an NFC chip operating in a LF or MF frequency band. The second chip 22 therefore has a functional circuit including a modulation and demodulation circuit configured to operate in one of these frequency bands. This second near field chip 22, can communicate with a reading terminal when it is located at a short distance, from a few millimeters to 1 m. The nature of the information exchanged, as for the first chip 21, is arbitrary and may include the unique identifier of the second chip 22 or any other type of information.

Similar to the first chip 21, the second chip 22 has two longitudinal connection areas to which the two wire elements 4a, 4b are respectively fixed, at longitudinal segments 4a2, 4b2. The areas of the second chip 22 are equipped with connection studs that connect each wire element to the functional device of this second chip 22. It also has, between its studs, a second characteristic impedance that can depend on frequency and is also usually capacitive in nature, of a few picofarads.

Figure 3B:
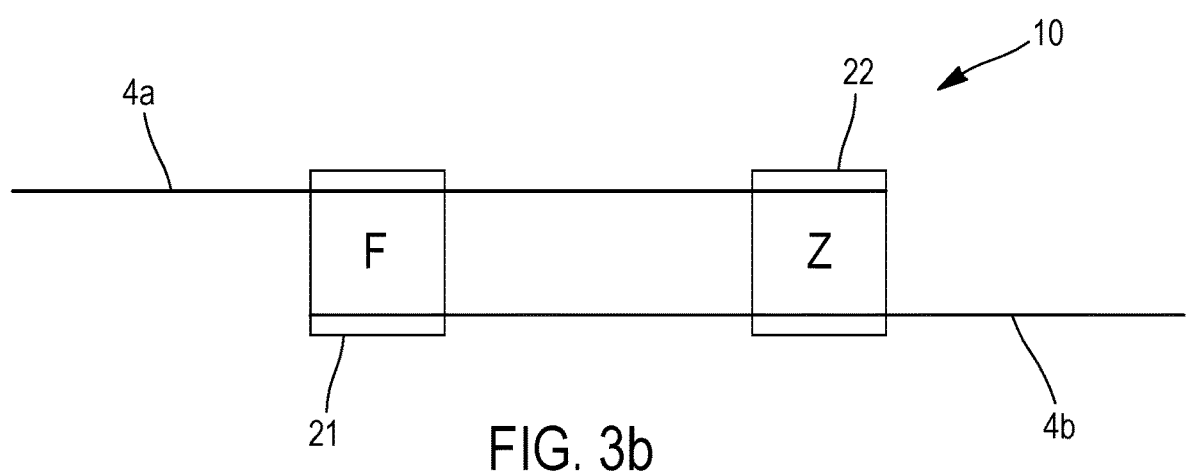
Figure 3C:
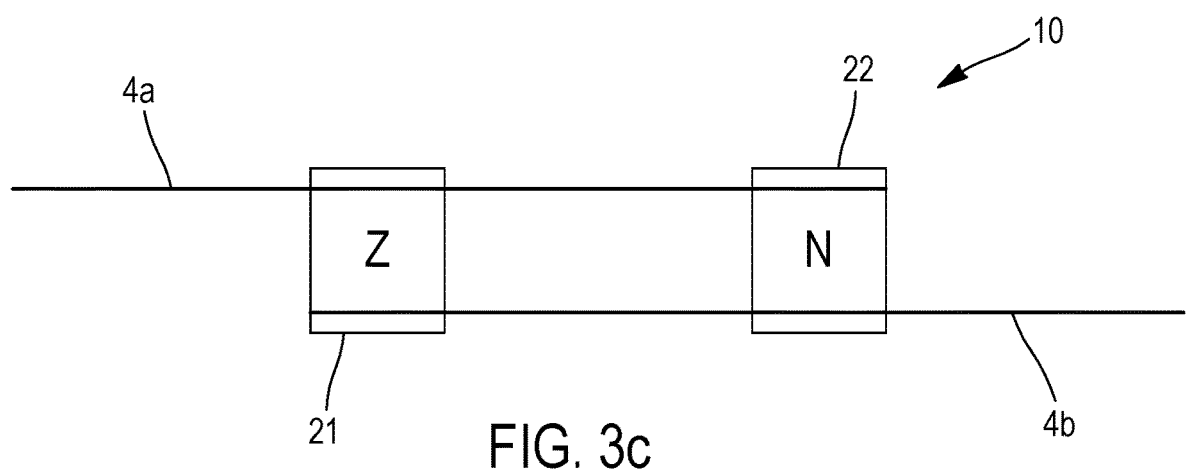

In the configuration shown in FIGS. 3a to 3c, a longitudinal segment 4a1 of the first wire element 4a, positioned in a central part of this wire element 4a, is fixed on a connection area of the first chip 21. Another longitudinal segment 4a2 of the first wire element 4a, positioned at the first end of this wire element 4a, is fixed in one of the connection areas of the second chip 22. Similarly, another longitudinal segment 4b2 of the second wire element 4b, positioned in the central part of this wire element 4b, is fixed in a connection area of the second chip 22. Another longitudinal segment 4b1 of the second wire element 4b, positioned at one end of this wire element 4b, is fixed on the other connection area of the first chip 21. As mentioned above, the connection areas can be in the form of grooves, and in this case the different longitudinal segments mentioned above 4a1, 4a2, 4b1, 4b2 are respectively housed in these grooves.

FIG. 3b schematically shows the transmission-reception device 10 when subjected to a high-frequency electromagnetic field, for example, with a frequency in one of the HF, UHF, VHF bands, and included in the operating frequency range of the first chip 21.

In this state, the first transmission-reception chip 21 is likely to work, i.e., if a coupling device, such as a dipole antenna, is electrically connected to its connection terminals, the first chip 21 is able to demodulate the supplied signal, perform processing and, in return, modulate information to be transmitted via the coupling device.

The second chip 22 is not likely to work at this frequency. That is to say, its behavior is purely passive and, given its connection terminals, it constitutes a pure impedance whose value corresponds to its characteristic impedance at this frequency.

FIG. 3c schematically shows the transmission-reception device 10 when subjected to a low-frequency electromagnetic field, for example, having a frequency in one of the LF or MF bands, and included in the operating frequency range of the second chip 22.

In this state, and in contrast to what has been presented in relation to FIG. 3b, the first far-field chip 21 is not likely to work and behaves as a pure impedance whose value corresponds to its characteristic impedance at this frequency. The second near-field chip 22, on the other hand, is capable of demodulating a signal supplied to it by a coupling device electrically connected to its terminals, performing processing, and modulating information to be transmitted via the coupling device.

The present disclosure uses these observations to ensure that, in the first frequency range, the first wire element 4a and the second wire element 4b electrically combine with the characteristic impedance of the second transmission-reception chip 22 to form a coupling device associated with the first transmission-reception chip 21.

In other words, the second chip 22, which is passive in the first frequency range, electrically combines with the wire elements 4a, 4b to form the antenna connected to the first chip 21 allowing the transmission-reception device 10 to be fully functional in this first frequency range.

In the second frequency range, the first and second wire element 4a, 4b electrically combine with the characteristic impedance of the first chip 21 to form a coupling device associated with the second chip 22. In other words, the first chip 21, which is passive in the second frequency range, electrically combines with the wire elements 4a, 4b to form the antenna connected to the second chip 22 allowing the transmission-reception device 10 to also be fully functional in this second frequency range.

Figure 4A:
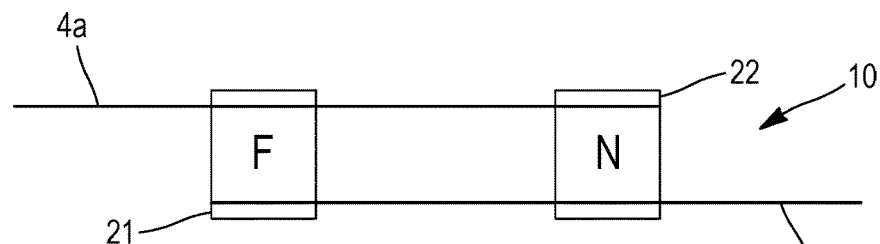
FIGS. 4a to 4c show the operating principle of a first embodiment of the present disclosure.

FIG. 4a represents the transmission-reception device 10 according to a first embodiment of the present disclosure. The device is configured in a way quite similar to what was presented in the general description.

Figure 4B:
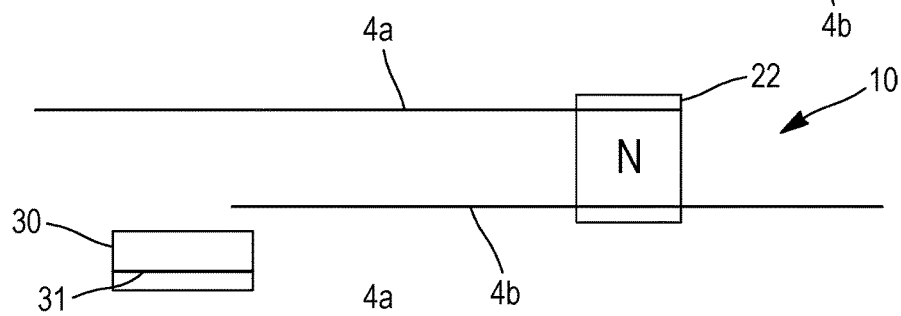

In FIG. 4b, the equivalent electrical diagram of device 10 in FIG. 4a is shown at the operating frequency of the second near-field chip 22. At this operating frequency, the first far-field chip 21 is passive, and its characteristic impedance being capacitive in nature, it constitutes an open circuit at the operating frequency of the second chip. In this configuration, the wire elements 4a, 4b electrically connected to the connection terminals of the second near-field chip 22 form transmission lines.

These transmission lines constitute the coupling device of the second near-field chip 22, capable of transmitting and receiving a radiofrequency electrical signal to another transmission line 31 of a transmission-reception terminal 30 located near the device 10. Preferably, to improve the quality of the transmission, the terminal's transmission line 31 is arranged parallel to the transmission line consisting of one of the wire elements 4a, 4b. It will also be possible to easily adapt the impedance of the coupling device in the form of transmission lines, by adjusting the length of the wire elements and/or adjusting the distance between these two wire elements, i.e., the distance between the connection areas to which the wire elements are fixed from the first and second transmission-reception chips 21, 22.

Figure 4C:
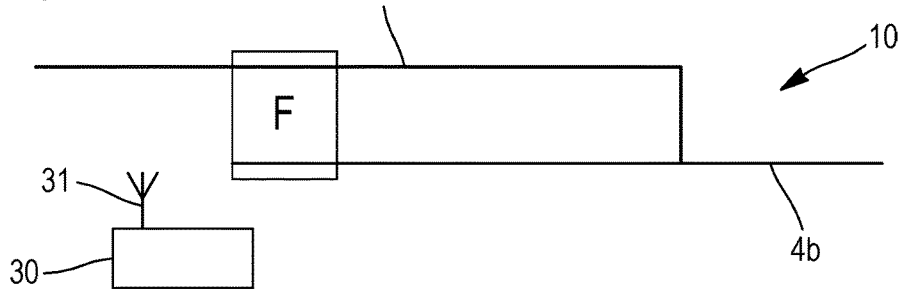

In FIG. 4c, the equivalent electrical diagram of device 10 in FIG. 4a is shown at the operating frequency of the first far-field chip 21, which is therefore included in the first operating frequency range.

At this operating frequency, the second chip 22 is passive and its characteristic impedance being of a capacitive nature, it constitutes at this frequency a short circuit.

In this configuration, the two wire elements 4a, 4b electrically connected to the connection terminals of the first far-field chip 21 form a dipole antenna. For this purpose, the length of each wire element is chosen to correspond to a quarter of the length of the propagating wave, as is well known in itself. The short circuit of the second near field chip 22 at the operating frequency of the first chip provides a loop for matching the antenna impedance. This effect can be used to choose the distance between first and second chips 21 and 22 so that this loop actually has the required size to allow this adaptation.

The coupling device thus constituted in dipole is able to transmit and receive a radiofrequency electromagnetic signal at the operating frequency of the first chip. It can communicate with a transmission-reception terminal 30 equipped with a compatible antenna 31. This transmission can be carried out at a long distance, up to several meters, between the transmission-reception device 10 and terminal 30.

Figure 5A:
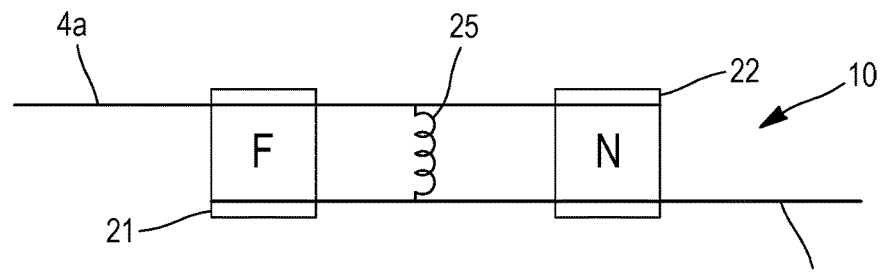
FIGS. 5a to 5c show the operation of a second embodiment of the present disclosure.

FIG. 5a represents the transmission-reception device 10 according to a second embodiment of the present disclosure. This second embodiment differs from the first embodiment in that an inductive component 25 has been added between the first wire element 4a and the second wire element 4b. This inductive element 25 is placed near or at the level of the longitudinal segments 4a1, 4b1 of the wire elements that are fixed on the connection areas of the first far-field chip 21.

Figure 5B:
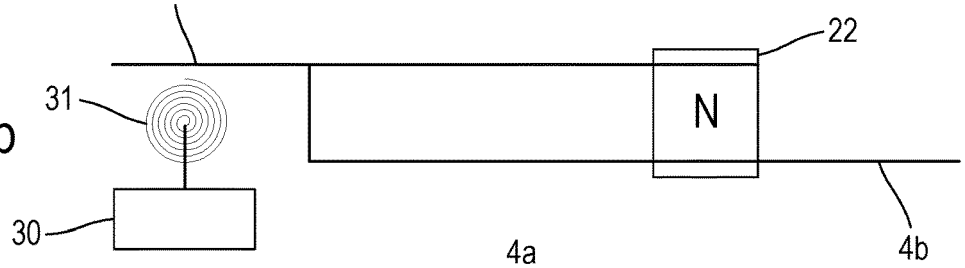

FIG. 5b shows the equivalent electrical diagram of device 10 in FIG. 5a at the operating frequency of the second near-field chip 22, and therefore included in the second operating frequency range. At this operating frequency, the inductive element 25, in parallel with the capacitive characteristic impedance of the first chip 21, forms a short circuit.

It should therefore be noted that at the operating frequency of the second chip 22, the wire elements 4a, 4b combine with the characteristic impedance of the first chip and the inductive element 25 to form a loop coupling device. The arrangement of this coupling device is capable of transmitting and receiving, by magnetic induction, a radiofrequency magnetic signal at the operating frequency of the second chip 22 and communicating with a transmission-reception terminal 30 equipped with its own coupling device 31.

Figure 5C:
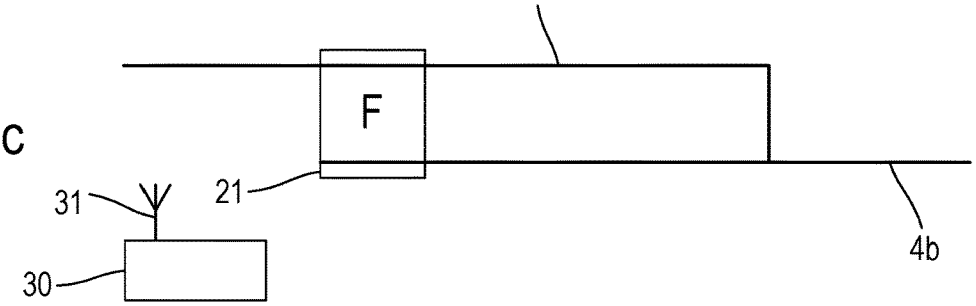

FIG. 5c shows the equivalent electrical diagram of the transmission-reception device 10 of this second embodiment at the operating frequency of the first chip 21. Inductive element 25, at this relatively high operating frequency, forms an open circuit. The configuration shown in FIG. 5c is identical to that of the first embodiment shown in FIG. 4c. The same comments apply and are not reproduced for the sake of brevity.

Figure 6:
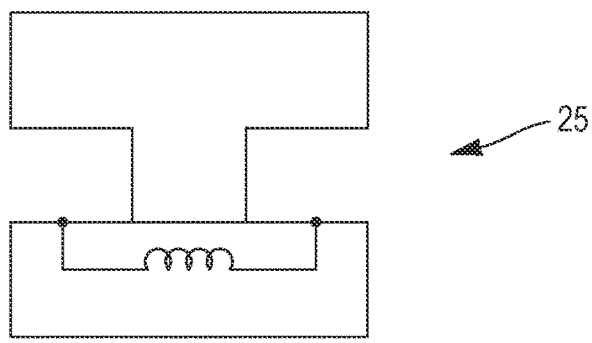
FIGS. 6 to 8 represent variants of the second embodiment.

Advantageously, and as shown in FIG. 6, the inductive element 25 is in the form of a chip compatible with E-THREAD™ technology. For this purpose, the chip is provided with two longitudinal grooves in which connection studs are placed to electrically connect wire elements to the functional device consisting of an inductance. More generally, the inductive element 25 can be in the form of a chip with two parallel connection areas.

Figure 7:
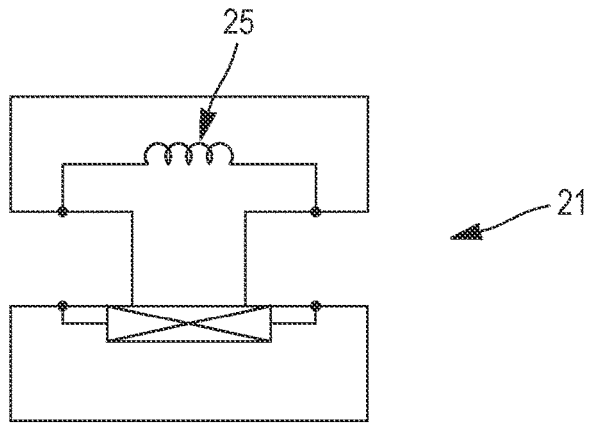

In a variant of this particularly advantageous second embodiment, the inductive element 25 is integrated into the first chip 21. This avoids the need to attach inductive element 25 separately between wire elements 4a and 4b. This variant can be implemented using a first chip 21, which integrates the inductive device 25 into a cover 7, for example, as shown in FIG. 7.

In order to promote electromagnetic coupling, the space between the two chips 21, 22 and forming at least part of the coupling device may be filled with a ferromagnetic material.

Figure 8:
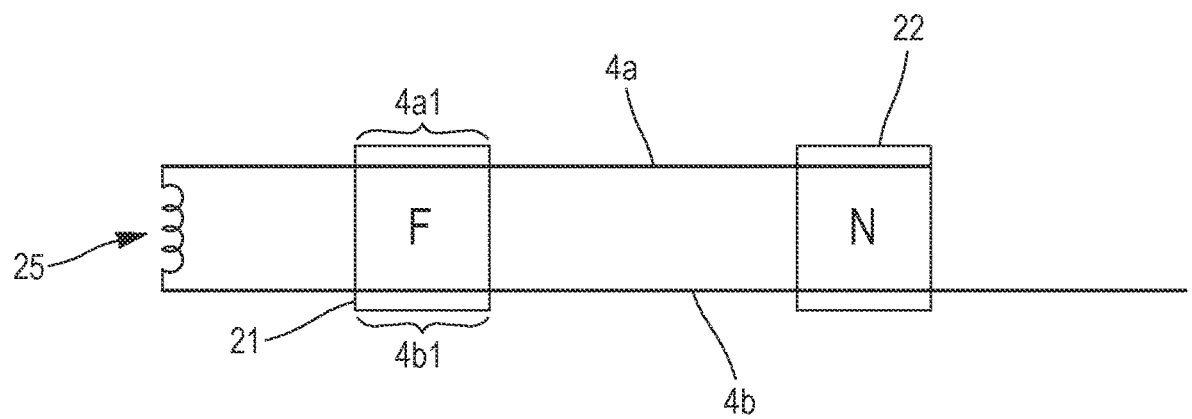

FIG. 8 shows a variant of the second embodiment. In this variant, the first chip 21 is associated with the wire elements 4a, 4b at longitudinal segments 4a1, 4b1 placed in the central parts of the wire elements 4a, 4b. The wire elements 4a, 4b therefore each have ends on either side of the first chip 21. The inductive element 25, which can be made in the form of a chip with connection areas, such as the grooves shown in FIG. 6, can therefore be placed on the side of the first chip 21 opposite the second chip 22. In this way, the loop coupling device may have a larger dimension than that obtainable with the configuration in FIG. 5a. A larger loop promotes magnetic coupling with terminal 30. Of course, this variant can be combined with the presence of a ferromagnetic body or substance inside the loop, as described above.

Whatever the embodiment chosen and the variants used, the transmission-reception device 10 according to the present disclosure has the characteristic of being able to operate in both near and far fields. The device 10 uses components, including first and second standard transmission-reception chips 21, 22, and is therefore available at low cost. It has a very advantageous form factor, and is not significantly more cumbersome than a transmission-reception device operating only in one of the near or far field transmission-reception modes.

Of course, the present disclosure is not limited to the described embodiments and alternative solutions can be used without departing from the scope of the present disclosure as defined in the claims.

Thus, although transmission-reception chips with a capacitive impedance have been chosen here in the different embodiments described, it is possible to consider implementing the present disclosure with transmission-reception chips with an impedance of a different nature. It will be easy to adapt to this situation by planning to place adaptation components between the two wire elements, similar to the inductive component 25, in order to obtain the equivalent electrical diagrams required in high and low frequency. It will also be possible, as is well known to the skilled person, to adjust the length, spacing and termination of the wire elements to adapt the impedance of the coupling device to the nature of the characteristic impedance of the first chip 21 and/or the second chip 22.

In addition, it is not necessary for both functionalities "in the near field" and "in the far field" of the transmission-reception device to be used. Consideration may be given to providing generic devices according to the present disclosure for which a user could use only one of both functionalities.

The invention claimed is:

1. A radio frequency transmission-reception device, comprising:
   a first conductive wire element and a second conductive wire element, each of the first and second conductive wire elements having a first end, a second end and a central part;
   a far-field transmission-reception first chip configured to operate in a first operating frequency range and exhibit a first characteristic impedance, and having two longitudinal connection areas, a first segment of each of the first and second conductive wire elements being attached respectively to the two longitudinal connection areas of the first chip; and
   a near-field transmission-reception second chip configured to operate in a second operating frequency range lower than the first operating frequency range and exhibit a second characteristic impedance, and having two longitudinal connection areas, a second segment of each of the first and second conductive wire elements being attached respectively to the two longitudinal connection areas of the second chip;
   wherein, during operation of the radio frequency transmission-reception device, the first conductive wire element and the second conductive wire element are configured to combine with the second characteristic impedance of the second chip so as to form a coupling device associated with the first chip in the first operating frequency range, the coupling device being a dipole antenna provided with an impedance matching loop; and
   wherein, during operation of the radio frequency transmission-reception device, the first conductive wire element and the second conductive wire element are configured to combine with the first characteristic impedance of the first chip so as to form a coupling device associated with the second chip in the second operating frequency range.

2. The device of claim 1, wherein the first chip and/or the second chip comprises a substrate comprising a functional circuit and a cover, the cover and the substrate configured such that the longitudinal connection areas comprises longitudinal grooves extending between the cover and the substrate.

3. The device of claim 2, wherein the first operating frequency range is within at least one of the HF, UHF or VHF frequency bands, and the second operating frequency range is within at least one of the LF or MF frequency bands.

4. The device of claim 3, wherein the first characteristic impedance and the second characteristic impedance have a capacitive nature.

5. The device of claim 4, wherein:
   a longitudinal segment of the first wire element in a central part of the first wire element is fixed on a connection area of the first chip;
   a longitudinal segment of the second wire element at one end of the second wire element is fixed to the other connection area of the first chip;
   a longitudinal segment of the first wire element at a first end of the first wire element is fixed on a connection area of the second chip; and
   a longitudinal segment of the second wire element in a central part of the second wire element is fixed on the other connection area of the second chip.

6. The device of claim 5, wherein the coupling device associated with the second chip in the second operating frequency range comprises transmission lines.

7. The device of claim 1, further comprising an inductive component respectively connected to the first wire element and the second wire element.

8. The device of claim 7, wherein the coupling device associated with the second chip in the second operating frequency range comprises a magnetic induction loop.

9. The device of claim 7, wherein the inductive component comprises a chip having two longitudinal connection areas to which two segments of the first and second wire elements are fixed.

10. The device of claim 9, wherein the inductive component is positioned on a side of the first chip opposite to the second chip.

11. The device of claim 9, wherein the inductive component is integrated into the first chip.

12. The device of claim 1, further comprising a ferromagnetic material in a space between the first chip and the second chip.

13. The device of claim 1, wherein the first operating frequency range is within at least one of the HF, UHF or VHF frequency bands, and the second operating frequency range is within at least one of the LF or MF frequency bands.

14. The device of claim 1, wherein the first characteristic impedance and the second characteristic impedance have a capacitive nature.

15. The device of claim 1, wherein:
- a longitudinal segment of the first wire element in a central part of the first wire element is fixed on a connection area of the first chip;
- a longitudinal segment of the second wire element at one end of the second wire element is fixed to the other connection area of the first chip;
- a longitudinal segment of the first wire element at a first end of the first wire element is fixed on a connection area of the second chip; and
- a longitudinal segment of the second wire element in a central part of the second wire element is fixed on the other connection area of the second chip.

16. The device of claim 15, wherein the coupling device associated with the second chip in the second operating frequency range comprises transmission lines.

\* \* \* \* \*